United States Patent [19]

Mizoguchi et al.

[11] Patent Number: 4,626,916
[45] Date of Patent: Dec. 2, 1986

[54] SOLID STATE IMAGE PICKUP DEVICE

[75] Inventors: Toyokazu Mizoguchi, Nagano, Japan; Jun-ichi Nishizawa, No. 6-16, 1-chome, Komegafukuro, Sendai City, Miyagi Pref., Japan; Sohbe Suzuki, Sendai, Japan; Takashige Tamamushi, Sendai, Japan

[73] Assignees: Olympus Optical Co., Ltd., Tokyo; Jun-ichi Nishizawa, Miyagi, both of Japan

[21] Appl. No.: 556,050

[22] Filed: Nov. 29, 1983

[30] Foreign Application Priority Data

Dec. 14, 1982 [JP] Japan .................. 57-217758

[51] Int. Cl.$^4$ .............................. H04N 3/14
[52] U.S. Cl. .......................... 358/213; 357
[58] Field of Search .............. 358/213, 212, 41; 357/24 LR

[56] References Cited

U.S. PATENT DOCUMENTS

| 4,336,557 | 6/1982 | Koch | 358/213 |
|---|---|---|---|
| 4,392,158 | 7/1983 | Aoki et al. | 358/213 |
| 4,496,980 | 1/1985 | Pfleiderer et al. | 358/212 |
| 4,518,863 | 5/1985 | Fukuoka et al. | 250/578 |

Primary Examiner—Gene Z. Rubinson
Assistant Examiner—Stephen Brinich
Attorney, Agent, or Firm—Parkhurst & Oliff

[57] ABSTRACT

A solid state image pickup device having a shutter function is disclosed. The device comprises a plurality of picture cells each having a static induction transistor arranged in a matrix. The device further comprises a plurality of gate signal lines for simultaneously supplying gate signals to the picture cells placed on respective rows of the matrix, a vertical scanning register for generating and scanning the gate signals, a plurality of signal readout lines for reading out light signals stored in the picture cells placed on respective columns of the matrix, a shift register for simultaneously and temporarily storing read out signals and converting them into time series signals, a device connected between the signal readout means and the temporary storage means for controlling the connection therebetween.

7 Claims, 14 Drawing Figures

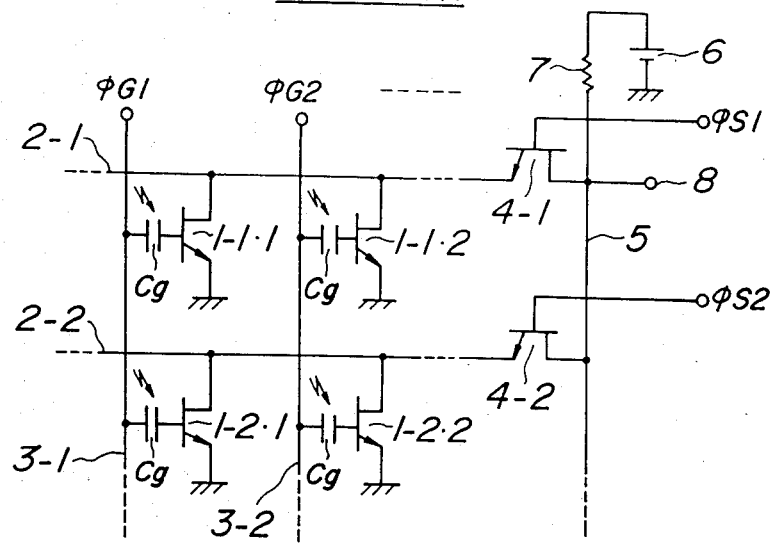
FIG_1
*PRIOR ART*
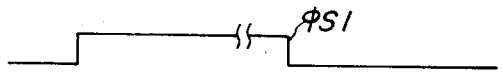
FIG_2a
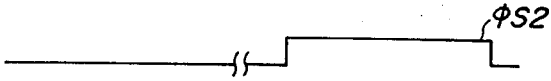
FIG_2b
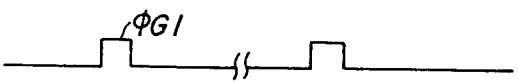
FIG_2c
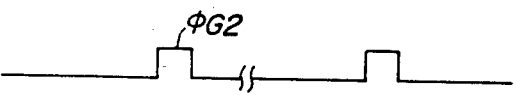
FIG_2d

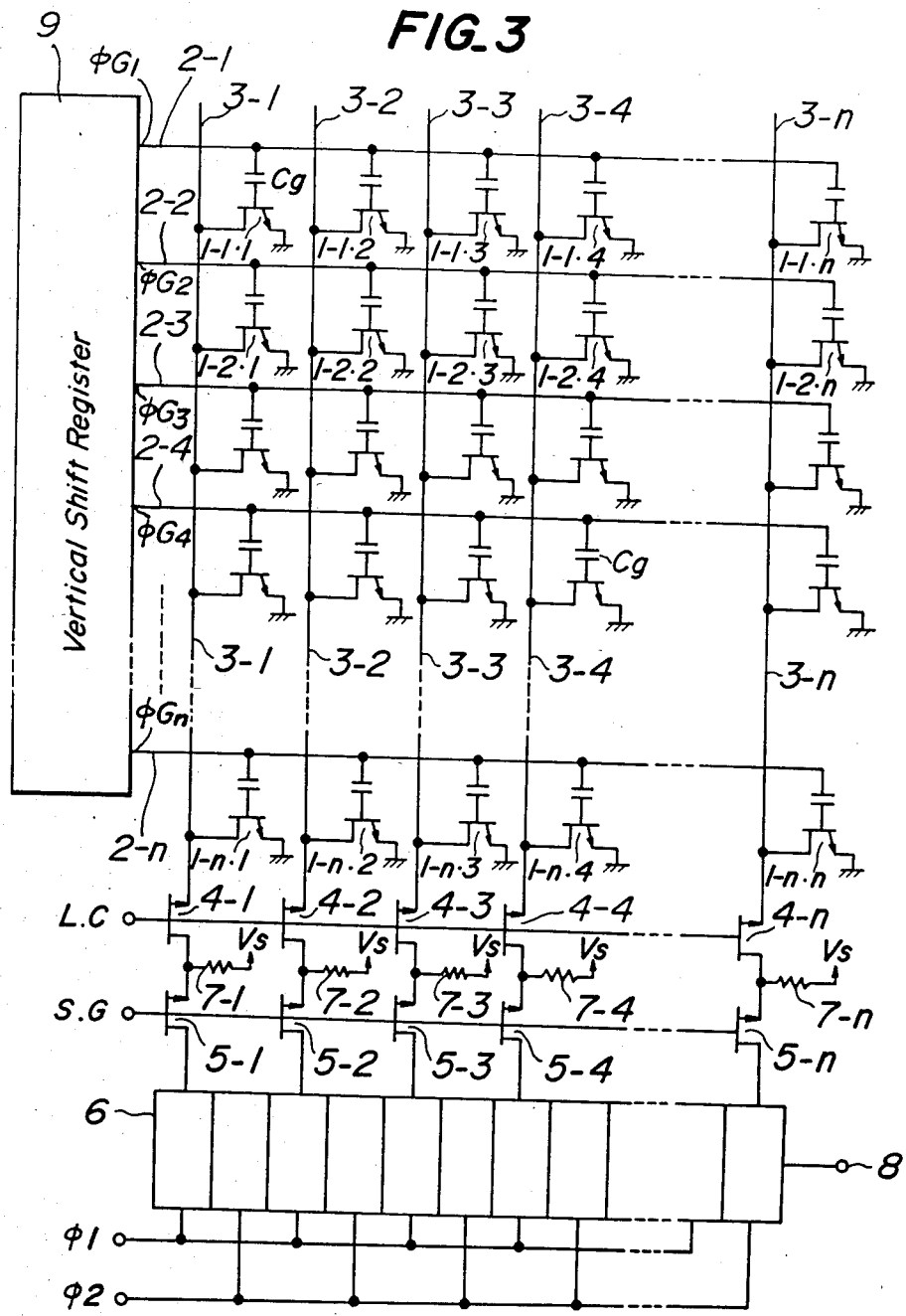

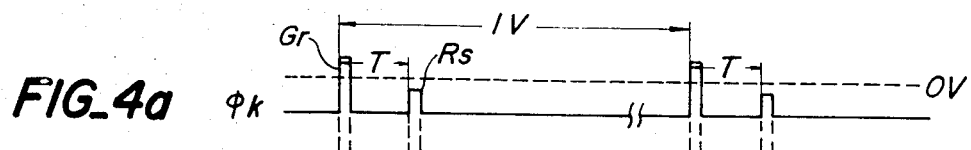
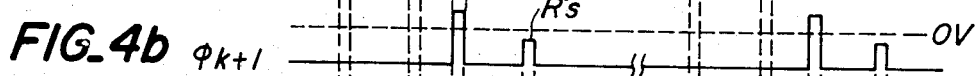
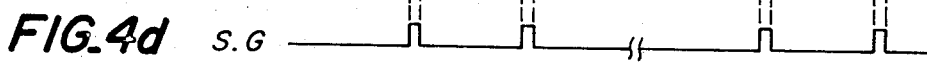
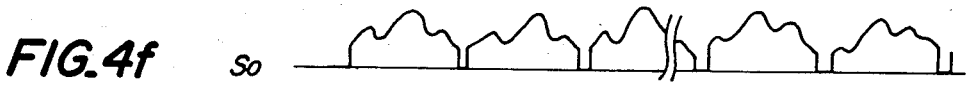

SOLID STATE IMAGE PICKUP DEVICE

BACKGROUND OF THE INVENTION

The present invention relates to a solid state image pickup device having a shutter function and by utilizing a static induction transistor as a solid state imaging element.

There has been widely used a solid state image pickup device comprising a charge coupled device or an MOS transistor. The present tendency is to replace these elements by a static induction transistor (hereinafter referred to as SIT element).

As an example, FIG. 1 shows a circuit arrangement of a solid state image pickup device constructed by arranging in a matrix a plurality of isolated gate SIT elements. FIG. 2 shows a waveform chart for explaining the operation of the isolated gate SIT arranged in a matrix as shown in FIG. 1. Respective SIT elements 1-1.1, 1-1.2, ..., 1-2.1, 1-2.2, ... are of an n channel SIT of normal OFF type and form a picture cell. Each picture cell receives light inputs and generates video signal outputs which are read out by an XY address system. As shown in FIG. 1, respective SIT elements 1-1.1, 1-1.2, ..., 1-2.1, 1-2.2, ... have source electrodes which are connected to respective vertical scanning lines 2-1, 2-2, ..., drain electrodes which are connected to a reference voltage source (in the embodiment shown, grounded voltage) and gate electrodes which are connected to respective horizontal scanning lines 3-1, 3-2, ... The horizontal scanning lines 3-1, 3-2, ... are successively selected by signals $\phi G_1$, $\phi G_2$, ... generated from a horizontal register (not shown). The vertical scanning lines 2-1, 2-2, ... are successively selected and connected to a readout signal line 5 through respective line selection switches 4-1, 4-2, ... which are made conductive by signals $\phi S_1$, $\phi S_2$ ... generated from a vertical register (not shown) during selected periods of one horizontal scanning line.

When the signal $\phi S_1$ having a duration equal to one line scanning period shown in FIG. 2a is supplied to the line selection switch 4-1 of the vertical scanning line 2-1 from the vertical register, the line selection switch 4-1 becomes conductive and source and drain electrodes of respective SIT elements 1-1.1, 1-1.2, ... corresponding to respective picture cells in the horizontal direction are biased to a certain voltage during a one line scanning period. Under this condition when the signal $\phi G_1$ shown in FIG. 2c is supplied to the horizontal scanning line 3-1 from the horizontal register, the SIT element 1-1.1 is selected so that the current equivalent to the charges caused by light, stored in a gate capacitance $C_g$ of SIT element 1-1.1 and having an amount corresponding to an amount of incident light, flows through a load resister 7, the transistor switch 4-1, and the SIT element 1-1.1 from a power supply source 6. As a result of this the variable component of the voltage drop generated in the load resistor 7 is obtained at an output terminal 8 as an output voltage corresponding to light incident upon the SIT element 1-1.1. In this way, after output signals corresponding to light inputs for the vertical scanning line 2-1 are read out successively from respective SIT elements 1-1.1, 1-1.2, ... the following vertical scanning line 2-2 is selected by the signal $\phi S_2$ shown in FIG. 2b from the vertical register so that signals $\phi G_1$, $\phi G_2$, ... generated from the horizontal register shown in FIGS. 2c and 2d drive respective SIT elements 1-2.1, 1-2.2 ..., source and drain electrodes of which are biased by the vertical scanning line 2-2 in the same manner as the above, and thus outputs of the SIT elements are successively read out. The same operations are successively repreated thereby obtaining required image pickup output.

In the conventional solid state image pickup device described above the signal reading out and signal resetting can simultaneously be performed for respective SIT elements constituting the picture cell so that only the shutter speed of a certain period determined by a scanning period from the time at which the given SIT element 1-1.1 is selected to the time at which the same SIT element 1-1.1 is again selected can be obtained. Under the condition that, for example, the line selection switch 4-1 is conductive by the signal $\phi S_1$, thereby supplying the voltage of the supply source 6 to the vertical scanning line 2-1, when the signal $\phi G_1$ is supplied to the horizontal scanning line 3-1 a part of charges stored in the gate capacitance $C_g$ corresponding to an amount of incident light for another SIT element 1-2.1 which is not selected on the same horizontal scanning line 3-1 is discharged through the source electrode thereof. In the television image pickup system SIT elements of about 500 lines are arranged so that the decreased amount of light charges reaches 20 to 30% of the initial signal amount. This decreased amount cannot be ignored and leads to uneven or blurred picture.

In the above solid state image pickup device constructed by arranging SIT elements each forming picture cell in a matrix only after reading out the signals of whole picture the picture cells can collectively be reset. In order to further increase the shutter speed an external mechanical shutter must be provided as an exposure control shutter.

SUMMARY OF THE INVENTION

It is an object of the present invention to eliminate the above described disadvantage of the conventional solid state image pickup device.

It is another object of the present invention to provide a solid state image pickup device having an electronic shutter function and capable of obtaining a picture with high sensitivity and quality by utilizing an SIT image sensor comprising SIT elements as a picture cell.

According to the present invention a solid state image pickup device comprising a plurality of picture cells each having a static induction transistor and arranged in a matrix, means for simultaneously supplying gate signals to the picture cells placed on respective rows of the matrix, means for generating the gate signals and scanning the gate signal supplying means, means for reading out light signals stored in the picture cells placed on respective columns of the matrix, means for simultaneously and temporarily storing light signals stored in the cells on the same row and converting them into time series signals, means connected between the signal read-out means and the temporary storage means for controlling the connection therebetween.

BRIEF DESCRIPTION OF THE DRAWINGS

FIG. 1 is a circuit diagram showing a construction of a conventional solid state image pickup device having SIT elements;

FIGS. 2a–2d is a waveform chart explaining the timing of drive signals used in the device shown in FIG. 1;

FIG. 3 is a circuit diagram showing one embodiment of a solid state image pickup device according to the present invention;

FIGS. 4a-4f is a waveform chart explaining the timing of respective signals used in the device shown in FIG. 3;

DETAILED EXPLANATION OF THE PREFERRED EMBODIMENT

Figure 5:
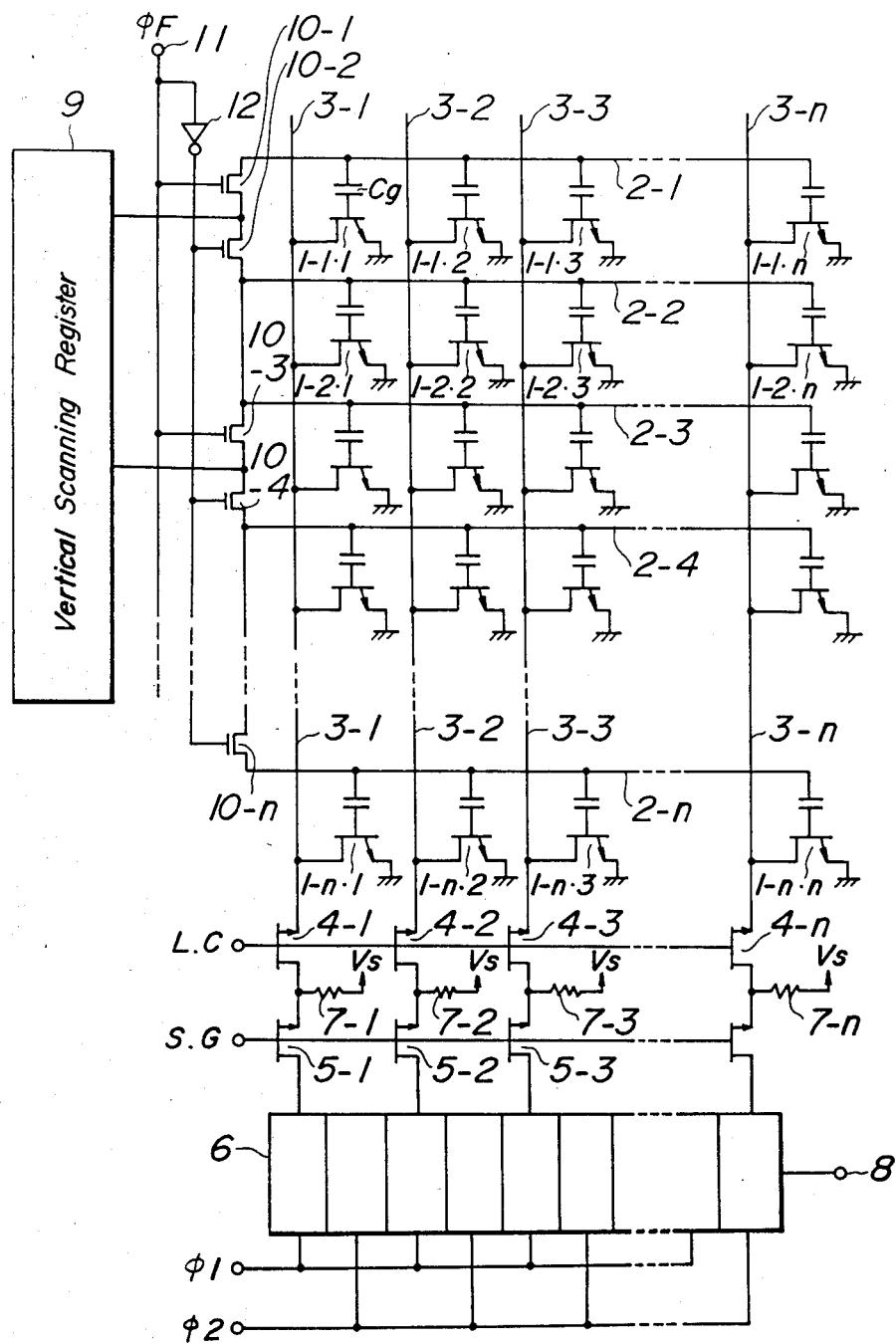
FIG. 5 is a circuit diagram showing another embodiment of the solid state image pickup device according to the present invention.

As is well known the SIT element has high light detection sensitivity and excellent integration. The present invention utilizes an SIT image sensor constructed by arranging such SIT elements each forming a unity picture cell in a matrix.

Referring now to FIG. 3, one embodiment of a solid state image pickup device according to the present invention will be explained. As shown in FIG. 3, reference numerals 1-1.1 to 1-1.n are SIT elements each having a capacitor $C_g$ coupled to respective signal storage gates. These SIT elements are arranged in a matrix and have gate electrodes connected to gate signal lines 2-1 to 2-n through respective capacitors $C_g$ and drain electrodes connected to respective signal readout lines 3-1 to 3-n. The gate signal lines 2-1 to 2-n are connected to a vertical shift register 9. Respective signal readout lines 3-1 to 3-n are connected through a series combination of readout line control switching elements 4-1 to 4-n and sampling gate switching elements 5-1 to 5-n to corresponding register unit of a shift register, for example, a shift register 6 (hereinafter referred to as "CCD shift register") which utilizes a charge transfer device driven by transfer pulses $\phi_1$, $\phi_2$. Reference numerals 7-1 to 7-n are load resisters for applying a bias voltage $V_s$ to the corresponding SIT element when the readout line control switching elements 4-1 to 4-n are made conductive by a control signal LC.

In the above construction it is supposed that reset signal pulses having a potential larger than 0 V shown in FIG. 4 by $G_r$ are supplied to the gate signal line 2-1. In this case signal storage gates of all SIT elements 1-1.1 to 1-1.n connected to the gate signal line 2-1 become positive. Then, PN junctions between the gate and source electrodes of SIT elements are forwardly biased to flow out charges stored in the signal storage gates so that the voltage of the signal storage gate becomes a constant value determined by its capacitor. Respective readout line control switching elements 4-1 to 4-n receive control signals LC shown in FIG. 4c which place signal readout lines 3-1 to 3-n in the OFF state, during a period that reset signal pulses $G_r$ are at least supplied to the gate signal lines 2-1 to 2-n. Respective signal readout lines 3-1 to 3-n, therefore, become floating during the period that reset signal pulses $G_r$ are supplied to the gate signal line 2-1 so that signals read out by reset signal pulses $G_r$ from the signal storage gates of respective SIT elements connected to the gate signal line 2-1 are released without supplying to the shift register 6 thereby surely resetting the respective SIT elements.

When a readout signal pulse $R_s$ is supplied to the gate signal line 2-1 after a period T, then the voltage of signal storage gates of SIT elements connected to the gate signal line 2-1 becomes a sum of the voltage due to charges stored in PN junction of a photo diode formed in the signal storage gate during the period T and the voltage of the supplied readout signal pulse so that respective SIT elements become ON state and thus light signals due to stored charges corresponding to light input can simultaneously be read out from respective SIT elements. In this case the readout line control switching elements 4-1 to 4-n for rendering respective signal readout lines 3-1 to 3-n switching ON and OFF states, become already conductive state. The readout signal pulse $R_s$ occurs later in time than the respective reset signal pulse $G_r$. Respective sampling gate switching elements 5-1 to 5-n are so constructed that pulses having the same duration and in synchronism with the readout signal pulse as shown in FIG. 4d are supplied as a control signal SG thereby simultaneously rendering them in the switching ON state, so that output signals of respective SIT elements connected to the same gate signal line, for example, 2-1 are simultaneously supplied to respective corresponding register units of the shift register 6. FIG. 4e shows an image signal S of one horizontal scanning line (corresponding to the gate signal line) simultaneously supplied to the shift register 6.

The above operation is performed to the same gate signal line with one field period so that reset signal pulses $G_r$, $G_r'$ of one horizontal scanning period H and readout signal pulses $R_s$, $R_s'$ are successively supplied to respective gate signal lines 2-1 to 2-n and thus simultaneous readout of light output of SIT elements connected to the same gate signal line with a period of 1H as shown in FIG. 4e by S', S", . . . can successively be performed on every gate signal line. The image signals thus read out are simultaneously stored in the respective corresponding register units of the CCD shift register 6. During 1H period before reading out the output signals from the SIT elements connected to the following gate signal line, for example, 2-2, the stored image signals are wholly shifted to the output side by clock pulses $\phi_1$, $\phi_2$ and converted to a time series signal $S_o$ thereby delivering it as a video output from an output terminal 8. It is assumed that clock pulses $\phi_1$, $\phi_2$ are synchronized with readout signal pulses $R_s$, $R_s'$.

In the same way respective gate signal lines 2-1 to 2-n and signal readout lines 3-1 to 3-n are successively driven thereby obtaining the video signal $S_o$ (FIG. 4f) of one picture from the video output terminal 8. That is, the video signal $S_o$ was obtained by performing an exposure of the time T as shown in FIG. 4a. This exposure time T, i.e. the shutter speed can optionally be set every 1 horizontal scanning period H by changing the timing of the reset signal pulses $G_r$ and $G_r'$.

In FIGS. 4a and 4b $\psi$k shows an optional gate signal line and $\psi$k+1 shows the next gate signal line followed to $\psi$k n-th gate signal line.

FIG. 5 shows another embodiment of the solid state image pickup device according to the present invention in which an interlaced scanning can be performed by using the device shown in FIG. 3. The same portions as those shown in FIG. 3 are given like reference characters. In this embodiment the major construction of the device is the same as that of the device shown in FIG. 3, except that reset signal pulses $G_r$, $G_r'$ and readout signal pulses $R_s$, $R_s'$ (both refer to FIG. 4) to be supplied to respective gate signal lines 2-1 to 2-n from a vertical scanning register 9 are alternately supplied to odd numbered gate signal lines 2-1, 2-3, . . . and even numbered gate signal lines 2-2, 2-4, . . . with the field period through line change-over switching elements 10-1 to 10-n being placed in the switching ON-OFF state by control signals $\phi_F$. This signal $\phi_F$ becomes "1" level and "0" level, alternately, for every field period.

That is, the control signals $\phi_F$ having "1" level with odd field and "0" level with even field supplied to an input terminal 11 are divided by two parts. One of the control signals $\phi_F$ renders odd numbered switching elements 10-1, 10-3, . . . conductive during odd numbered field periods thereby successively supplying drive signals $G_r$, $R_s$ to odd numbered gate signal lines 2-1, 2-3, . . . . The other of the control signals $\phi_F$ is supplied to even-number line changeover switching elements 10-2, 10-4, . . . through an inverter circuit 12 and renders these switching elements 10-2, 10-4, . . . ON state during even numbered field periods thereby successively supplying reset signal pulses $G_r$ and readout signal pulses $R_s$ to even numbered gate signal lines 2-2, 2-4, . . . from the vertical scanning register 9.

In this embodiment the relation of reset operation and signal readout operation is the same as that of the previous embodiment, except that respective image pickup outputs are obtained during odd numbered and even numbered field periods by interlaced scanning, so that its explanation is omitted. In this way frame video signals consisting of odd and even field signals can be obtained from the video output terminal 8.

In order to obtain video signals by the television standard system it is necessary to use following numerical values, 490 or more vertical picture cells, 400 to 700 horizontal cells, $1H \cong 63.5$ μsec of pulse period of $\psi_G$ successively supplied to respective gate signal lines 2-1 to 2-n ($\psi_G$ is a generic name of reset signal pulses $G_r$, $G_r'$, . . . and readout signal pulses $R_s$, $R_s'$, . . . ), about 100 nsec for the pulse duration, and 6 MHz to 10 MHz for the drive pulses $\phi_1$, $\phi_2$ of the CCD shift register 6 in connection with the horizontal picture cell. When readout signal pulses $R_s$ and reset signal pulses $G_r$ are continuously supplied to the same gate signal line the light charge storage time of the SIT element forming each picture cell is $1V \cong 33.3$ msec so that the moving picture of 30 frame/sec can be image picked-up.

Figure 6:
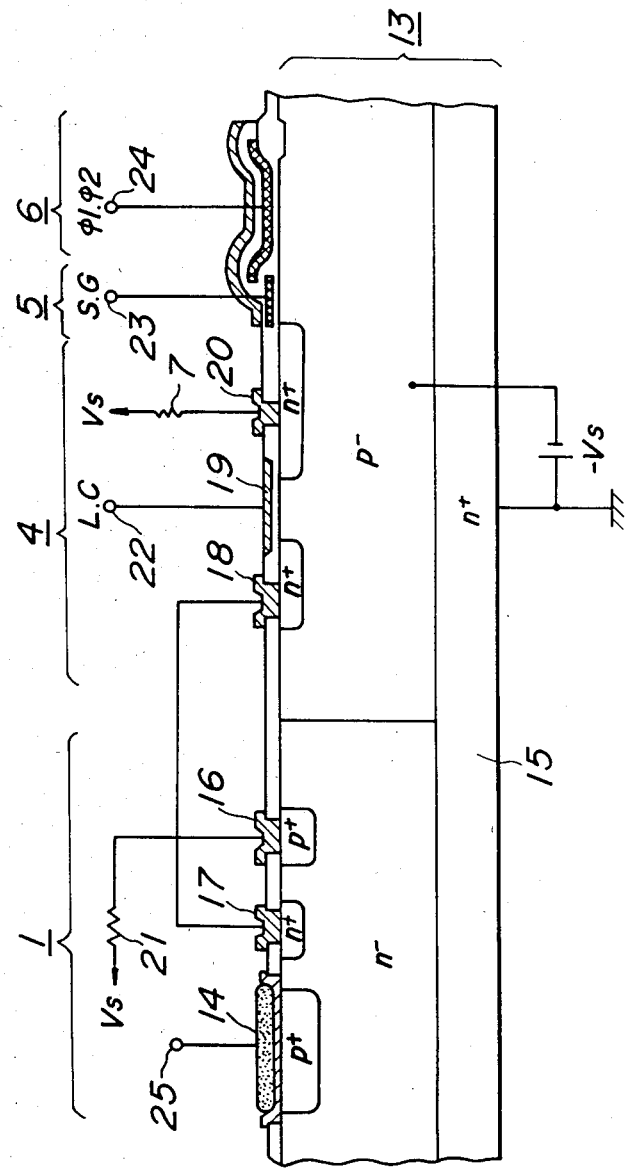
FIG. 6 is a cross sectional view showing a construction of an image sensor having SIT elements used in the device according to the present invention.

FIG. 6 is a cross-sectional view showing an image sensor comprising SIT elements used in the solid state image pickup device according to the present invention.

In FIG. 6 reference numeral 13 is a Si substrate, on which an SIT element 1, an n channel MOS transistor 4 forming a readout line control switching element, a CCD5 forming a sampling gate switching element and a CCD shift register 6 are integrally formed. In FIG. 6 reference numeral 14 is an SIT signal storage gate, reference numeral 15 is a SIT source electrode, reference numeral 16 is a SIT isolated gate, reference numeral 17 is a SIT drain electrode, reference numerals 18, 19 and 20 are source, gate and drain electrodes of MOS transistor 4, respectively, and reference numeral 21 is a shielding resistor. The shielding resistor 21 and the load resistor 7 are connected to a voltage supply source $V_s$. Moreover, reference numeral 22 is an input terminal of a signal readout line control signal LC, 23 is an input terminal of sampling control signal SG, 24 is an input terminal of drive clock pulse of the CCD shift register 6, and 25 is a connection terminal to the gate signal line.

In the embodiments shown in FIGS. 3 and 5 CCD is used as the shift register 6 but the CCD shift register 6 may be replaced by a construction wherein respective signal readout lines 3-1 to 3-n are provided with capacitors for holding readout signals and these capacitors are successively scanned by transistors driven by another digital shift register thereby obtaining time series signals shown in FIG. 4f.

According to the present invention readout signal pulses are supplied to the gate signal line, light output signals are simultaneously read out from the SIT elements of the same gate signal line, and the output signals thus read out are simultaneously stored in the shift register and converted into time series signals during the period until next light output signals are simultaneously read out from SIT elements of the next gate signal line, thereby obtaining video signals, so that no readout signal pulses are supplied to SIT elements which are not accessed. Therefore, decrease in stored charge of inaccessed cell as in the conventional device does not occur so that picture quality by the image pickup output can be improved. Moreover, capability of resetting stored charges of SIT elements with a timing of a gate signal line unit (1 line), and the image pickup by an interline system are very easy and use is made of SIT element as a picture cell so that the solid state image pickup device having a shutter function can be obtained with high sensitivity and picture quality.

What is claimed is:

1. A solid state image pickup device comprising:
   a plurality of picture cells each having a static induction transistor and arranged in a matrix having rows and columns,
   means including a plurality of gate signal lines for supplying reset signal pulses and readout signal pulses to said picture cells placed on the same rows of said matrix with different timing, each reset signal pulse occurring earlier in time than a respective readout signal pulse,
   means for generating said reset signal pulses and readout signal pulses and for scanning said gate signal supplying means said with said different timing,
   means for reading out light signals stored in said picture cells placed on the same column of said matrix,
   means for supplying said reset signal pulses having a positive potential enough to bias a PN junction between gate and drain regions of a respective SIT in the forward direction so as to successively reset charges stored in all of said SIT's of every said gate signal line, thereby changing said exposure time from reset instant to readout instant by changing the reset timing,
   means for simultaneously and temporarily storing light signals stored in said cells on the same row and for converting said light signals into time series signals, and
   switching means connected between said signal readout means and said temporary storage means for controlling the connection therebetween.

2. A solid state image pickup device as claimed in claim 1, wherein said signal readout means is a plurality of signal readout lines.

3. A solid state image pickup device as claimed in claim 1, wherein said gate signal generating means is a vertical scanning register.

4. A solid state image pickup device as claimed in claim 1, wherein said temporary storage and conversion means is a shift register having a plurality of register units.

5. A solid state image pickup device as claimed in claim 4, wherein said switching means comprises a plurality of line control switching elements operable in a switching ON or OFF state, simultaneously, and a plurality of sampling gate switching elements, operable in a switching ON or OFF state, simultaneously, a series combination of said line control switching element and said sampling gate switching element being connected between said respective signal readout lines and said shift register.

6. A solid state image pickup device as claimed in claim 5, wherein said readout signal pulses and control signals for controlling said switching elements are synchronized with clock pulses for driving said shift register, and signals of the cells on a row stored in the shift register being shifted before said readout signal pulses are supplied to an adjacent gate signal line thereby preparing storage of input signals simultaneously read out by supplying readout signals to said adjacent gate signal line.

7. A solid state image pickup device as claimed in claim 1, wherein odd numbered gate signal lines and even numbered gate signal lines are alternately selected in connection with a field period, said image signals corresponding to stored charges according to light input being simultaneously read out from said SIT elements on said gate signal lines which are successively selected with said line period, thereby obtaining a video signal output of an interlaced scanning system.

* * * * *